(12) United States Patent
Kan et al.

(10) Patent No.: US 11,821,919 B2
(45) Date of Patent: Nov. 21, 2023

(54) SHORT-CIRCUIT PROBE CARD, WAFER TEST SYSTEM, AND FAULT DETECTION METHOD FOR THE WAFER TEST SYSTEM

(71) Applicant: Winbond Electronics Corp., Taichung (TW)

(72) Inventors: Chung-Hsuan Kan, Hukou Township (TW); Shu-Chi Lin, Taichung (TW); Yih-Chau Chen, Taichung (TW); Yuan-Long Tsai, Taichung (TW); Hsuan-Min Ho, Taichung (TW)

(73) Assignee: WINDBOND ELECTRONICS CORP., Taichung (TW)

( * ) Notice: Subject to any disclaimer, the term of this patent is extended or adjusted under 35 U.S.C. 154(b) by 591 days.

(21) Appl. No.: 16/912,021

(22) Filed: Jun. 25, 2020

(65) Prior Publication Data

US 2021/0123951 A1    Apr. 29, 2021

(30) Foreign Application Priority Data

Oct. 29, 2019 (TW) .................. 108138958

(51) Int. Cl.
*G01R 1/073* (2006.01)
(52) U.S. Cl.
CPC ................. *G01R 1/07342* (2013.01)

(58) Field of Classification Search
CPC .... G01R 1/07342; G01R 31/52; G01R 35/00; G01R 31/2886
See application file for complete search history.

(56) References Cited

U.S. PATENT DOCUMENTS

2005/0017708 A1* 1/2005 Miller .................... G01R 35/00
324/750.01
2014/0091826 A1* 4/2014 Chui .................. G01R 1/07378
324/756.03

FOREIGN PATENT DOCUMENTS

| CN | 104280651 A | 1/2015 |
| TW | 200516256 A | 5/2005 |
| TW | 201830026 A | 8/2018 |

* cited by examiner

*Primary Examiner* — Lee E Rodak
(74) *Attorney, Agent, or Firm* — Birch, Stewart, Kolasch & Birch, LLP

(57) ABSTRACT

The present invention provides a short-circuit probe card, including: a substrate having an upper surface and a lower surface; a plurality of first contacts formed on the upper surface; and a plurality of second contacts formed on the lower surface and connected to the plurality of first contacts. The first contacts and second contacts are all grounded.

8 Claims, 6 Drawing Sheets

SHORT-CIRCUIT PROBE CARD, WAFER TEST SYSTEM, AND FAULT DETECTION METHOD FOR THE WAFER TEST SYSTEM

CROSS REFERENCE TO RELATED APPLICATIONS

This Application claims priority of Taiwan Patent Application No. 108138958, filed on Oct. 29, 2019, the entirety of which is incorporated by reference herein.

BACKGROUND OF THE INVENTION

Field of the Invention

The invention relates to a short-circuit probe card, a wafer test system, and a fault detection method for the wafer test system, which can quickly distinguish the location of a fault in the wafer test system.

Description of the Related Art

Mass-produced wafers are put into a wafer test system in sequence so that they can be electrically tested. The wafer test system has a test head and a probe card, and uses the test head to contact the wafer through the probe card. Before doing formal testing, the machine must be pre-tested to ensure that the test head and probe card itself are not faulty (such as short circuit or open circuit), to avoid misjudgment of the wafer during the formal testing. However, when the pre-test finds a fault, it is not known whether the fault occurred in the test head or in the probe card, and so both the test head and the probe card need to be inspected and repaired in a series of complicated steps, which uses up a lot of manpower and time.

BRIEF SUMMARY OF THE INVENTION

The invention provides a short-circuit probe card, a wafer test system, and a fault detection method for the wafer test system, which can quickly identify the location of a fault in the wafer test system.

The invention provides a short-circuit probe card, including: a substrate having an upper surface and a lower surface; a plurality of first contacts formed on the upper surface; and a plurality of second contacts formed on the lower surface and connected to the first contacts, wherein the first contacts and the second contacts are all grounded.

The invention provides a wafer test system for electrical testing of wafers, including: a short-circuit probe card with a plurality of contacts that are grounded; a test head connected to the contacts of the short-circuit probe card; and a contact monitoring device that is connected to the test head to test whether the contacts are all short-circuited.

The invention provides a fault detection method for a wafer test system, including: connecting a test head to a probe card; making a probe surface of the probe card contact a wafer to detect a plurality of detection points; checking if there is an open circuit in the detection points; replacing the probe card with a short-circuit probe card when there is an open circuit in the detection points, wherein all contacts on the short-circuit probe card are grounded; and checking whether there is still an open circuit in the detection points.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
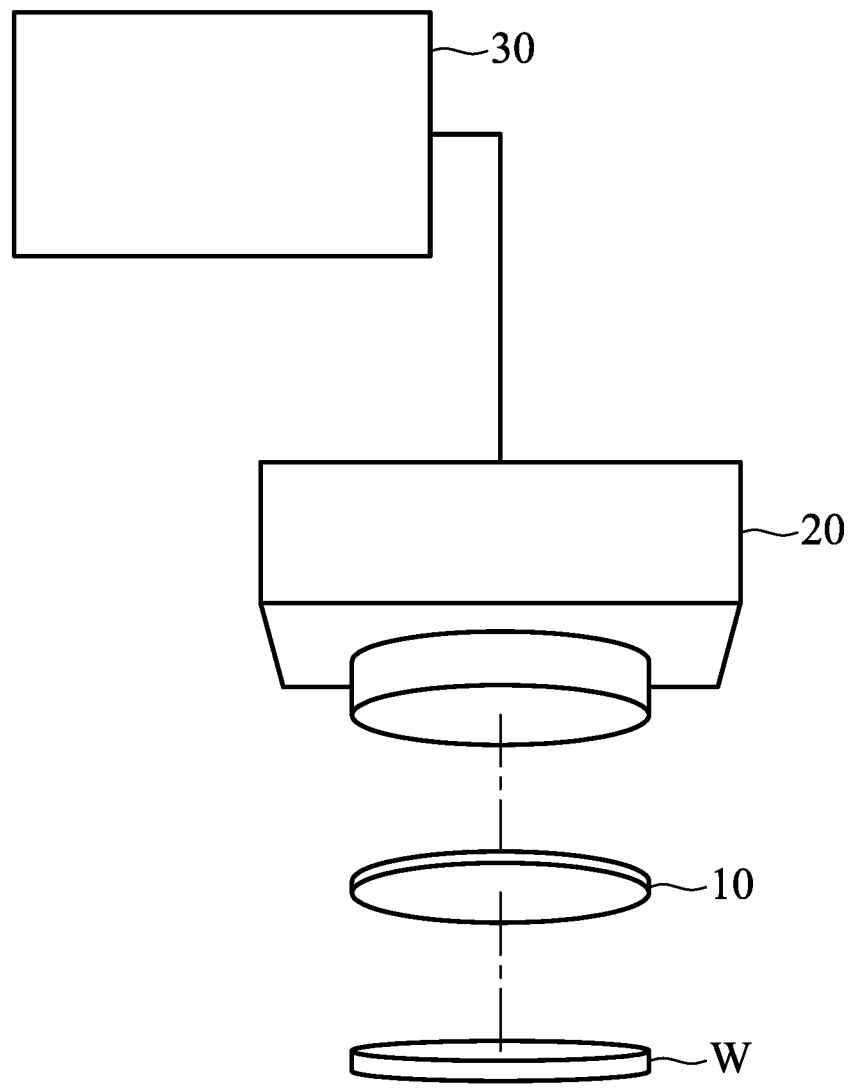
FIG. 1 is a schematic architecture diagram of a wafer test system of the present invention.

The following description provides many different embodiments, or examples, for implementing different features of the disclosure. Elements and arrangements described in the specific examples below are merely used for the purpose of concisely describing the present disclosure and are merely examples, which are not intended to limit the present disclosure. For example, descriptions on structure that a first feature is on or above a second feature may refer to cases where the first feature and the second feature are in direct contact with each other, or it may refer to cases where there is another feature disposed between the first feature and the second feature, such that the first feature and the second feature are not in direct contact.

The spatially related terms used above, such as above or below, are only used to briefly describe the relationship between an element or a feature relative to another element or another feature on the drawing. In addition to the orientation described on the drawings, it also includes devices used or operated in different orientations. The shapes, sizes, and thicknesses in the drawings may not be drawn to scale or may be simplified for the purpose of clarity, and are provided for illustrative purposes only.

FIG. 1 is a schematic architecture diagram of a wafer test system of the present invention. The wafer test system 1 includes a probe card 10, a test head 20, and a contact monitoring device 30. When a wafer is tested, the lower surface of the probe card 10 (that is, the probe surface) contacts the wafer W through probes. The upper surface of the probe card 10 is electrically connected to the test head 20 through the probe-card-side connector, and the test head 20 transmits signal to the contact monitoring device 30. Therefore, the contact monitoring device 30 can determine whether there is a short circuit or an open circuit abnormality on the path of the test head 20 through the probe card 10 to the wafer W based on the received signal.

The upper surface and the lower surface of the probe card 10 are provided with contacts electrically connected to each other. The contacts on the upper surface of the probe card 10 are electrically connected to the probe-card-side connector (not shown), and the contacts on the lower surface are electrically connected to probes also provided on the lower surface. The distribution pattern of the probes will be designed according to the wafer W to be measured. Therefore, when different wafers W are detected, the probes on the probe card 10 need to be configured corresponding to the wafers W.

The front end of the test head 20 has a test-head-side connector (not shown) for electrically connecting with the probe-card-side connector.

The contact monitoring device 30 may be, for example, a computer in which a contact monitoring program is installed to monitor the electrical connection between the wafer W, the probe card 10 and the test head 20. When the contact monitoring device 30 executes the contact monitoring program, according to the signal from the test head 20, the electrical connection status (such as voltage) between the wafer W, the probe card 10 and the test head 20 can be displayed on a display for the operator to view the detection result.

Figure 2B:
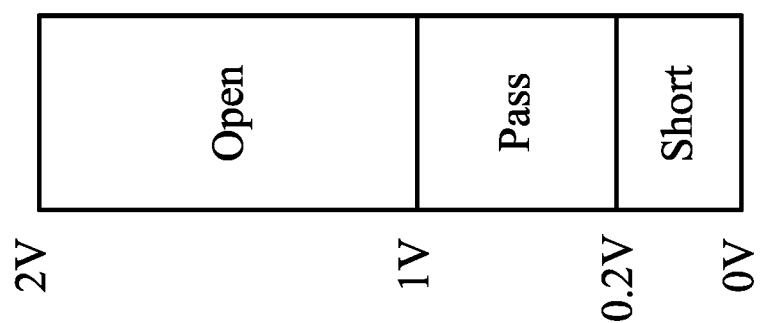
FIG. 2B shows an example of voltage judgment levels when the probe card is used for detection.
Figure 2A:
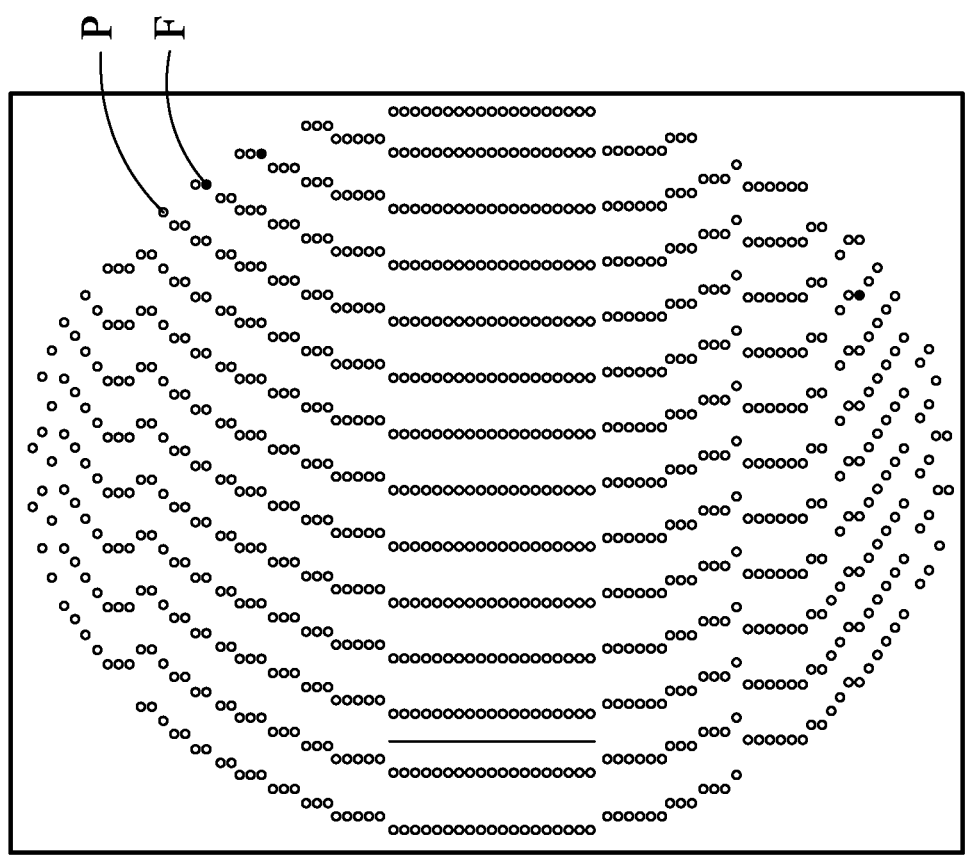
FIG. 2A is an example in which a contact monitoring device of the present invention displays a detection result on the display.

For example, when the wafer test system 1 tests the wafer W, the contact monitoring device 30 can execute the contact monitoring program to display the results of detecting the wafer W with all the probes on the display. As shown in FIG. 2A, a number of points will be displayed on the screen, where the detection points P indicated by ○ represent detection points that passes the detection, and the detection points F indicated by ● represent detection points that fails the detection (such as short circuit and open circuit). For example, as shown in FIG. 2B, the contact monitoring program can pre-set the points where the voltage is between 0 and 0.2V (short circuit) and higher than 1V (open circuit) displayed as detection points F that fail the detection, and the points where the voltage is between 0.2 and 1 V displayed as detection points P that pass the detection. In addition, each point has detailed detection information (such as voltage, etc.). When there is a detection point F that fails the detection, the operator can confirm that the detection point F is open or short-circuited, and then troubleshoot.

For example, when the detection point F that fails the detection is in a short-circuit state, first of all, a different place on the wafer W can be tested again. If the same short-circuit detection point F continues to appear, it means that the wafer test system 1 itself has a short circuit problem. At this time, it must be further determined whether the probe card 10 or the test head 20 is short-circuited for maintenance. In an embodiment, the probe card 10 can be removed from the wafer test system 1 first. If the short-circuit detection point F becomes in an open-circuit state, it means that the probe card 10 has a short circuit problem. If the detection point F still shows in a short circuit state, it means that the test head 20 has a short circuit problem. In this way, it is possible to quickly identify whether the probe card 10 or the test head 20 has a short circuit problem, and immediately perform troubleshooting.

When the detection point F that fails the detection is in an open circuit state, a different place on the wafer W can be tested again as well. If the same open-circuit detection point F continues to appear, it means that the wafer test system 1 itself has an open circuit problem. At this time, it must be further determined whether the probe card 10 or the test head 20 is open for maintenance. However, as long as the probe card 10 is removed from the wafer test system 1, all the detection points must be displayed as open detection points F, so the probe card 10 and the test head 20 must be inspected separately to confirm the fault location, and this may cause a problem of complicated and time-consuming steps.

Figure 3A:
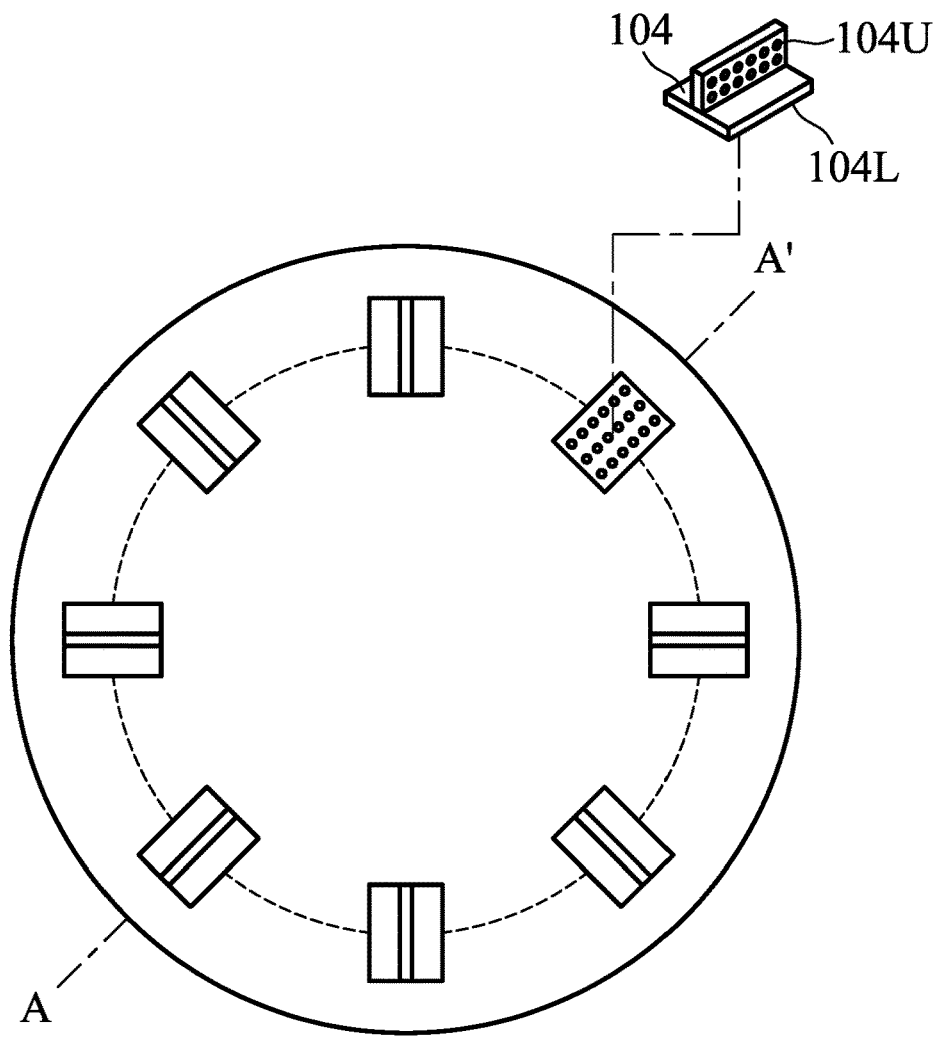
FIG. 3A is a top view of a short-circuit probe card according to an embodiment of the invention.
Figure 3B:
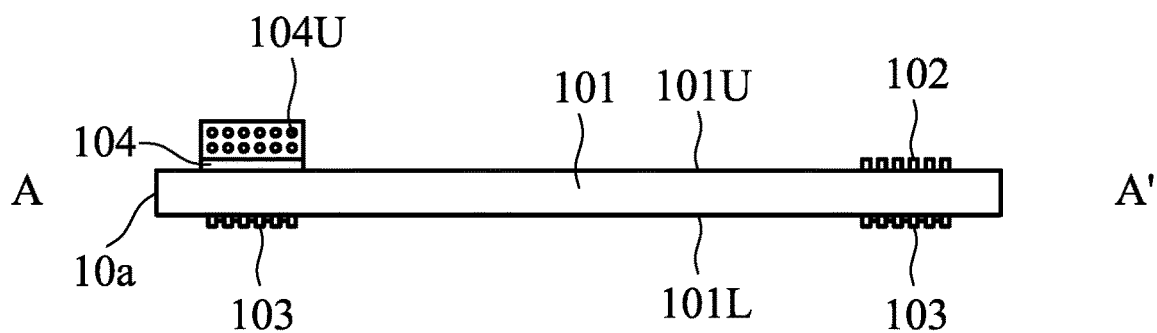
FIG. 3B is a cross-sectional view taken along line A-A' of the short-circuit probe card of FIG. 3A.

The following embodiments further provide a short-circuit probe card of the present invention and a method for quickly identifying whether the probe card 10 or the test head 20 in the wafer test system 1 is open-circuited by the short-circuit probe card. First, a short-circuit probe card 10a is provided. The short-circuit probe card 10a can be modified from the probe card 10, for example. FIG. 3A is a top view of a short-circuit probe card according to an embodiment of the invention. FIG. 3B is a cross-sectional view taken along line A-A' of the short-circuit probe card of FIG. 3A. As can be seen from FIGS. 3A and 3B, the short-circuit probe card 10a has a circular substrate 101. A plurality of first contacts 102 are formed on the upper surface 101U of the substrate 101. A plurality of second contacts 103 are formed on the lower surface 101L of the substrate 101, and each second contact 103 is electrically connected to one of the first contacts 102 on the upper surface 101U.

In particular, all the second contacts 103 in the short-circuit probe card 10a of the present invention are all grounded by welding or the like. In this way, the potentials of all the contacts on the short-circuit probe card 10a are all grounded to form a short circuit. In other embodiments of the present invention, all the first contacts 102 may be grounded by welding to form a short circuit effect.

In one embodiment, the upper surface 101U of the short-circuit probe card is further provided with a plurality of connectors 104 (that is, the aforementioned probe-card-side connectors) for engaging the short-circuit probe card 10a with the test head 20. The connector 104 has a bottom plate and an upright wall rising from the center of the bottom plate, and viewed from the side is an inverted T-shape. A plurality of upper contacts 104U are formed on both sides of the upright wall, and a plurality of lower contacts 104L (connector contacts) are formed on the lower surface of the bottom plate. Each upper contact 104U is electrically connected to a lower contact 104L. Each lower contact 104L of the connector 104 is in contact with one of the first contacts 102 on the upper surface 101U. In this way, the electrical data can be transmitted through the electrical connection path formed by the upper contact 104U, the lower contact 104L, the first contact 102, and the second contact 103.

Figure 4:
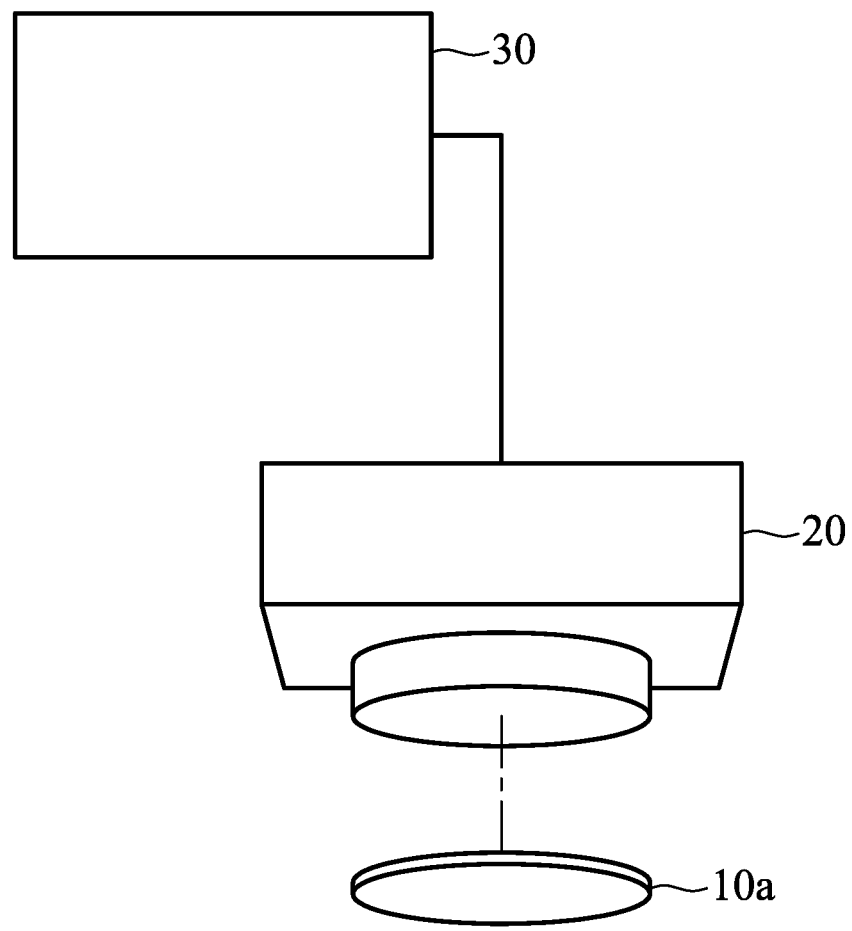
FIG. 4 is a schematic structural diagram showing that the short-circuit probe card is replaced in the wafer test system of the present invention.

When an open circuit fault occurs in the wafer test system 1, the present invention can quickly distinguish whether the probe card 10 or the test head 20 is open-circuited by the short-circuit probe card 10a. Specifically, for example, as shown in FIG. 4, the probe card 10 is removed from the wafer test system 1 and replaced with the short-circuit probe card 10a. Here, since the second contacts of the short-circuit probe card 10a are all grounded, after the test head 20 is engaged, the contact monitoring device 30 should detect a detection result indicating a short circuit. At this time, if there is an open-circuit detection point, it means that the test head 20 has an open circuit fault; on the contrary, if there is no open-circuit detection point, it means that the original probe card 10 has an open circuit fault. In this way, by replacing the short-circuit probe card 10a into the wafer test system 1, the location of an open circuit fault in the wafer test system 1 can be quickly identified.

Figure 5:
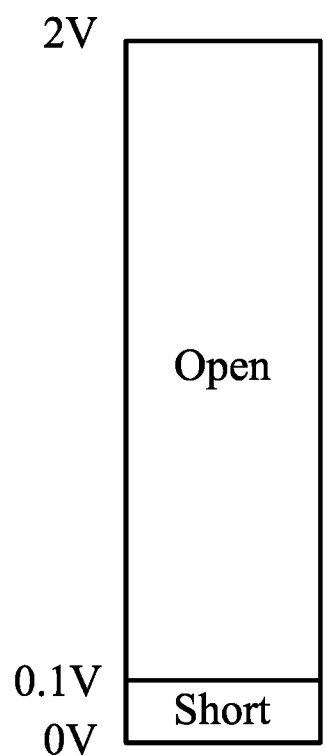
FIG. 5 shows an example of voltage judgment levels when the short-circuit probe card is used for detection.

In one embodiment, according to the use of the short-circuit probe card 10a, the judgment level and display method of the contact monitoring device 30 to judge a short circuit and an open circuit can be modified. FIG. 5 shows an example of voltage judgment levels when the short-circuit probe card 10a is used for detection. Here, when the detected voltage is between 0 and 0.1 V, the contact monitoring device 30 can determine that it is a short circuit, and display it with a detection point ○ that passes the detection. When the detected voltage is higher than 0.1V, the contact monitoring device 30 can determine that it is an open circuit, and display it with a detection points ● that fails the detection, so as to facilitate rapid visual judgment. In other words, when the detected voltage is between 0 and 0.1 V, it means that the original probe card 10 has an open circuit fault. When the detected voltage is higher than 0.1, it means that the test head 20 has an open circuit fault.

Figure 6:
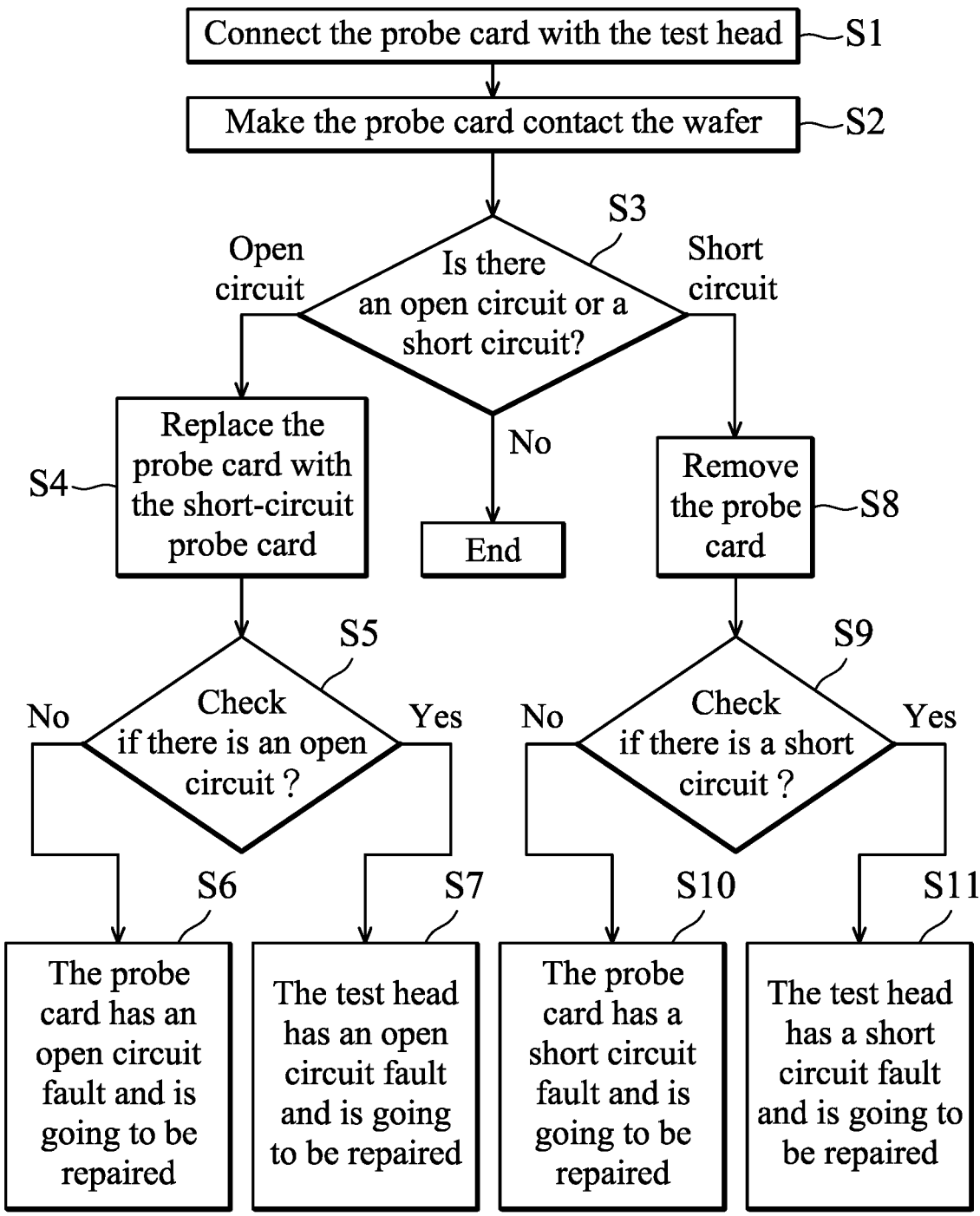
FIG. 6 is a flowchart of fault detection method for the wafer test system of the present invention.

Next, a fault detection method for the wafer test system of the present invention will be described. FIG. 6 is a flowchart of fault detection method for the wafer test system of the present invention. In FIG. 6, a pre-test is first performed to detect whether the wafer test system 1 is faulty. In step S1, the test head 20 and the probe card 10 are connected. Next, in step S2, the probe on the lower surface (i.e., the probe surface) of the probe card 10 is brought into contact with the wafer W to obtain a detection result. In step S3, it is confirmed whether there is a detection point F that fails the detection. If there is no detection point F that fails the detection, it means that the wafer test system 1 is free of trouble and all steps are ended. If a detection point F that fails the detection is displayed in the detection result, it is further determined whether it is an open circuit or a short circuit according to the voltage level. If the detection point F that fails the detection is an open circuit, the process proceeds to step S4 to determine which part is open-circuited, and if the detection point F that fails the detection is a short circuit, the process proceeds to step S8 to determine which part is short-circuited.

In step S4, the probe card 10 is removed and replaced with the short-circuit probe card 10a of which all contacts are grounded as shown in FIGS. 3A and 3B. Next, in step S5, the connection state of the short-circuit probe card 10a is checked. At this time, since all the contacts of the short-circuit probe card 10a are short-circuited, if the detection result shows that there is no open circuit, it can be confirmed that the open fault originally detected in step S3 is on the probe card 10, and the probe card 10 is going to be repaired (step S6). Conversely, if the detection result shows that there is an open-circuit detection point, it can be confirmed that the open fault originally detected in step S3 is on the test head 20, and the test head 20 is going to be repaired (step S7).

When it is determined in step S3 that there is a short-circuit detection point F, the process proceeds to step S8. In step S8, the probe card 10 is removed. Next, in step S9, the state of the test head 20 itself is checked. At this time, if the detection result shows that there is no short circuit on the wafer test system, it can be confirmed that the short circuit fault originally detected in step S3 is on the probe card 10, and the probe card 10 is going to be repaired (step S10). On the contrary, if the detection result shows that there is still a short-circuit detection point, it can be confirmed that the short circuit fault originally detected in step S3 is on the test head 20 and the test head 20 is going to be repaired (step S11).

According to the above fault detection method for the wafer test system, it can quickly detect whether the wafer test system 1 has an open circuit fault or a short circuit fault, and confirm the location of the fault, thereby saving the time for repeatedly confirming the fault states of the probe card 10 and the test head 20.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A short-circuit probe card, comprising:
    a substrate having an upper surface and a first lower surface;
    a plurality of connectors having a bottom plate and an upright wall rising from a center of the bottom plate;
    a plurality of first contacts formed on the upper surface; and
    a plurality of second contacts formed on the first lower surface and connected to the plurality of first contacts,
    wherein the plurality of first contacts and the plurality of second contacts are all grounded;
    wherein a plurality of upper contacts are formed on both sides of the upright walls of the connectors, and a plurality of lower contacts are formed on second lower surfaces of the bottom plates, and wherein each of the connectors is disposed on the upper surface so that the plurality of lower contacts are electrically connected to at least some of the first contacts.

2. The short-circuit probe card as claimed in claim 1, wherein the plurality of second contacts are welded to a ground.

3. The short-circuit probe card as claimed in claim 1, wherein the plurality of first contacts are welded to a ground.

4. A wafer test system for electrical testing of wafers, comprising:
    the short-circuit probe card as claimed in claim 1;
    a test head connected to the plurality of first contacts of the short-circuit probe card; and
    a contact monitoring device that is connected to the test head to test whether the plurality of first contacts and the plurality of second contacts are all short-circuited.

5. A fault detection method for a wafer test system, comprising:
    connecting a test head to a probe card;
    making a probe surface of the probe card contact a wafer to detect a plurality of detection points;
    checking if there is an open circuit in the plurality of detection points;
    replacing the probe card with the short-circuit probe card as claimed in claim 1 when there is an open circuit in the plurality of detection points; and
    checking whether there is still an open circuit in the plurality of detection points.

6. The fault detection method for a wafer test system as claimed in claim 5, wherein the step of checking whether there is still an open circuit in the plurality of detection points comprises:
    determining that the probe card has an open circuit fault if there is no open circuit in the plurality of detection points; and
    determining that the test head has an open circuit fault if there is still an open circuit in the plurality of detection points.

7. The fault detection method for a wafer test system as claimed in claim 5, further comprising:
    making the probe surface of the probe card contact the wafer;
    checking if there is a short circuit in the plurality of detection points;
    removing the probe card when there is a short circuit in the plurality of detection points; and
    checking whether there is still a short circuit in the plurality of detection points.

8. The fault detection method for a wafer test system as claimed in claim 7, wherein the step of checking whether there is still a short circuit in the plurality of detection points comprises:
   determining that the probe card has a short circuit fault if there is no short circuit in the plurality of detection points; and
   determining that the test head has a short circuit fault if there is still a short circuit in the plurality detection points.

* * * * *